(12) United States Patent
Barrenscheen

(10) Patent No.: US 9,054,515 B2
(45) Date of Patent: Jun. 9, 2015

(54) CURRENT MEASUREMENT AND OVERCURRENT DETECTION

(71) Applicant: Infineon Technologies Austria AG, Villach (AT)

(72) Inventor: Jens Barrenscheen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 197 days.

(21) Appl. No.: 13/916,470

(22) Filed: Jun. 12, 2013

(65) Prior Publication Data

US 2014/0368147 A1     Dec. 18, 2014

(51) Int. Cl.
*G01R 31/02* (2006.01)
*H02H 9/02* (2006.01)
*G01R 19/00* (2006.01)

(52) U.S. Cl.
CPC ........... *H02H 9/025* (2013.01); *G01R 19/0092* (2013.01)

(58) Field of Classification Search
CPC .. G01R 31/343; G01R 31/42; G01R 19/0092; G01R 19/0007
USPC ......................................................... 318/490
See application file for complete search history.

(56) References Cited

U.S. PATENT DOCUMENTS

2014/0253109 A1* 9/2014 Singh et al. .................... 324/227

* cited by examiner

*Primary Examiner* — Karen Masih
(74) *Attorney, Agent, or Firm* — Shumaker & Sieffert, P.A.

(57) ABSTRACT

Techniques are described for determining the amount of current flowing through an electrical conductor of an isolation device by measuring the voltage level across the electrical conductor. The isolation device also includes a sensor that provides a measure of the amount of current flowing through the electrical conductor. By using both the voltage level and the sensor to determine the amount of current flowing through the electrical conductor, the techniques provide for verifying the current measurements made by the isolation device. Also, the techniques provide for fast overcurrent protection.

20 Claims, 4 Drawing Sheets

CURRENT MEASUREMENT AND OVERCURRENT DETECTION

TECHNICAL FIELD

This disclosure is related to current measurement and overcurrent detection, and more particularly to phase current measurement and overcurrent detection of the phase current.

BACKGROUND

Electrical motors are driven by electrical current. During operation of an electrical motor, it is generally desirable to measure the electrical current to determine whether any modification to the current is needed. The measurement of the electrical current can also be used for diagnostic and protection purposes.

SUMMARY

In general, the techniques described in this disclosure are related to leveraging the pre-existing electrical conductor that drives a load (e.g., an electric motor) as a shunt for one way of determining the amount of current flowing to the load. For example, a circuit may determine the voltage level across the electrical conductor to determine the amount of current flowing to the load. The electrical conductor may be part of an isolating device. In some examples, the isolating device outputs a signal, which is electrically isolated, that can also be used to determine the amount of current flowing through the electrical conductor.

In one example, this disclosure describes a system comprising an isolation device and a current diagnostic circuit. The isolation device includes an electrical conductor and a current sensor. In this example, the current sensor is configured to output a signal indicative of an amount of current flowing through the electrical conductor. The current diagnostic circuit is configured to determine a voltage level across the electrical conductor of the isolation device, and determine a supplemental measurement of an amount of current flowing through the electrical conductor based on the determined voltage. In this example, the supplemental measurement is supplemental to a measurement of the amount of current flowing through the electrical conductor determined using the sensor of the isolation device.

In one example, this disclosure describes a method for current diagnostic, the method comprising determining a voltage level across an electrical conductor of an isolation device. In this example, the isolation device includes the electrical conductor and a current sensor, and the current sensor is configured to output a signal indicative of an amount of current flowing through the electrical conductor. The method also includes determining a supplemental measurement of an amount of current flowing through the electrical conductor based on the determined voltage. In this example, the supplemental measurement is supplemental to a measurement of the amount of current flowing through the electrical conductor determined using the sensor of the isolation device.

In one example, this disclosure describes a system comprising means for determining a voltage level across an electrical conductor of an isolation device. In this example, the isolation device includes the electrical conductor and a current sensor, and the current sensor is configured to output a signal indicative of an amount of current flowing through the electrical conductor. The system also includes means for determining a supplemental measurement of an amount of current flowing through the electrical conductor based on the determined voltage. In this example, the supplemental measurement is supplemental to a measurement of the amount of current flowing through the electrical conductor determined using the sensor of the isolation device.

The details of one or more techniques of this disclosure are set forth in the accompanying drawings and the description below. Other features, objects, and advantages of the disclosure will be apparent from the description and drawings, and from the claims.

DETAILED DESCRIPTION

Figure 1:
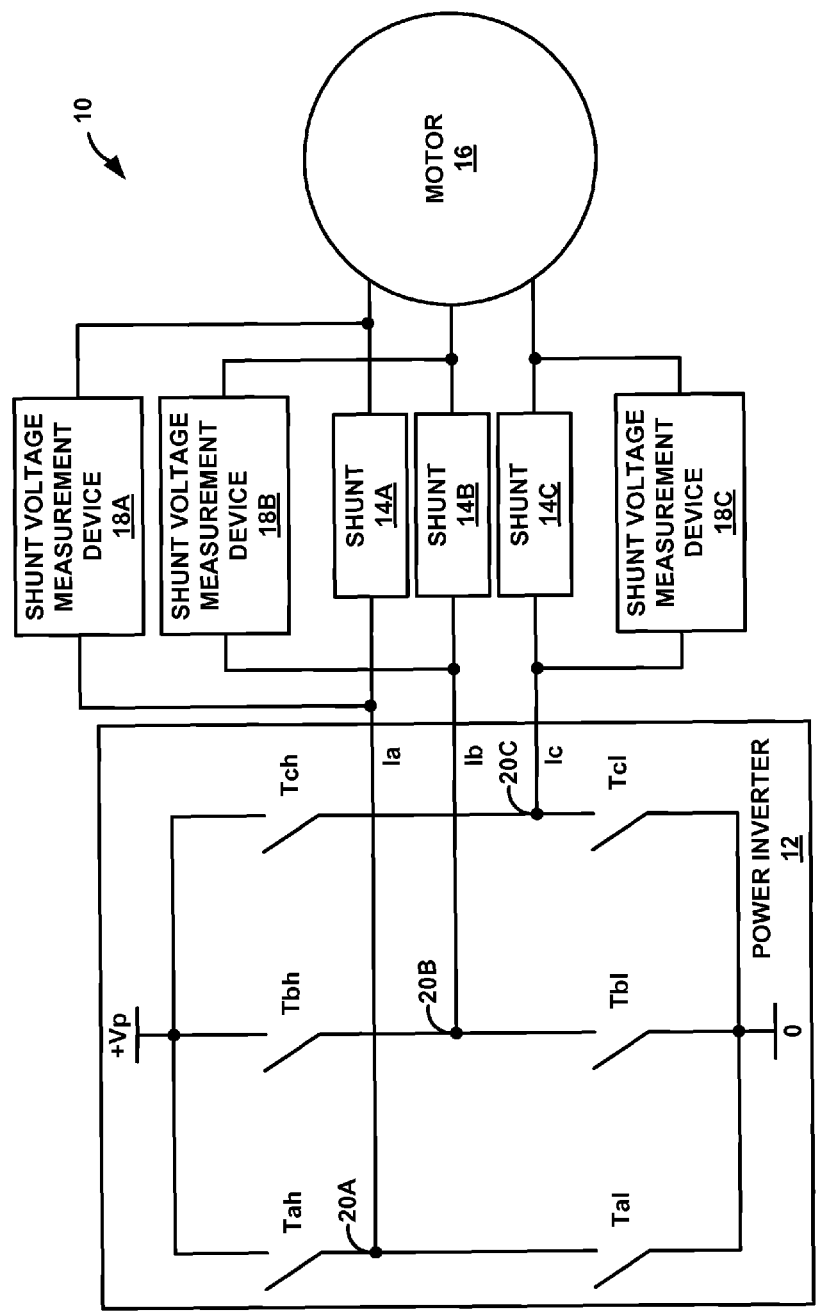
FIG. 1 is a block diagram illustrating an example system for driving an N-phase electrical motor.

The techniques described in this disclosure leverage an electrical conductor, which drives a load, as a shunt for purposes of determining the amount of current flowing to the load. The electrical conductor may pre-exist in the system that delivers current to the load. For example, the electrical conductor may comprise a conductive portion of a current sensor, such as a Hall sensor. According to the techniques described herein, a secondary current measurement may be performed, in order to supplement a primary current measurement made with the Hall sensor. In this manner, the techniques described in this disclosure may reduce additional components that would be otherwise needed to determine a secondary (e.g., supplemental) measurement of the amount of current flowing to the load. For example, rather than using additional shunt resistors for purposes of determining the amount of the current that is delivered to the load, the techniques utilize the pre-existing electrical conductor as a shunt. Removal of such shunt resistors reduces the overall cost of the system and potentially provides additional advantages described in more detail below.

In the techniques described in this disclosure, an N-phase electrical motor is driven by current flowing through N electrical conductors, where the N electrical conductors output current to the electrical motor such that the sum of all phase currents is zero. In this example, the N-phase electrical motor is the load. One example of the electrical conductor is the electrical conductor of an isolating device (e.g., a Hall sensor). The isolating device also includes components that output a signal used to determine the amount of current flowing through the electrical conductor of the isolating device in an electrically isolated manner. In other words, a Hall sensor is one example of an isolating device that delivers current to a load and outputs signals that are electrically isolated from the current to the load, and the Hall sensor is one example of an isolating device that can be used to determine the amount of current flowing to the load.

For purposes of illustration, the techniques are described with respect to an N-phase electrical motor (e.g., a three-phase electrical motor) as being the driven load, and the electrical conductor being part of a Hall sensor. However, the techniques described in this disclosure are not so limited and can be extended to other types of electrical loads. Also, the isolating devices described in this disclosure are not limited to Hall sensors, and any type of isolating device that drives the load and outputs a signal that indicates the amount of current that drives the load may be utilized.

In the techniques described in this disclosure, a controller causes a plurality of high-side and low-side drivers to enable and disable switches to cause current to flow through the electrical conductors of the N-phases. For example, a first electrical conductor is coupled to a first high-side switch and a first low-side switch, a second electrical conductor is coupled to a second high-side switch and a second low-side switch, and so forth. The first high-side switch is coupled to a first high-side driver and the first low-side switch is coupled to a first low-side driver, and so forth. The controller may cause the high-side drivers and the low-side drivers to selectively enable and disable respective high-side and low-side switches.

During operation of the electrical motor, it may be beneficial to determine the amount of current that each electrical conductor is delivering. As one example, the torque generated by the electrical motor is correlated to the amount of current delivered to the electrical motor. To ensure that the electrical motor is not generating too much torque or not enough torque, it may be beneficial to determine the amount of current delivered to the electrical motor during operation of the electrical motor.

One way to determine the amount of current delivered to the electrical motor is through the isolating device (e.g., the Hall sensor) that includes the electrical conductor. For example, the isolating device that includes the electrical conductor includes a component that outputs a signal indicative of the amount of current flowing through the electrical conductor. In this example, the signal indicative of the amount of current flowing through the electrical conductor and the current flowing through the electrical conductor are electrically isolated (e.g., not referenced to the same ground potential).

For instance, there may not be a direct current path from the electrical conductor of the isolating device and the component of the isolating device that outputs the signal indicative of the amount of current flowing through the electrical conductor. Rather, there is a gap between the electrical conductor and the component of the isolating device that outputs the signal indicative of the amount of current flowing through the electrical conductor. The flow of current through the electrical conductor causes a magnetic field that the component senses, and the magnitude of the magnetic field may be proportional to the amount of current flowing through the electrical conductor.

The controller may receive the signal indicative of the amount of current flowing through the electrical conductor and determine the amount of current flowing to the electrical motor based on the received signal. In some cases, determining the amount of current flowing to the electrical motor based solely on the received signal may not be sufficient to fail-proof the system, may not be sufficient to provide diagnostic capabilities during operation of the electrical motor, and may not be sufficient to protect against sudden failures (e.g., overcurrent).

In the techniques described in this disclosure, a current diagnostic circuit determines a voltage level directly across the electrical conductor of the isolating device. As one example, a first side of the electrical conductor is coupled to the ground potential of the current diagnostic circuit, and a second side of the electrical conductor is the coupled to the current diagnostic circuit. The current diagnostic circuit may determine the voltage difference between the first side and the second side of the electrical conductor. Based on the determined voltage level and the known resistance of the electrical conductor of the isolating device, the current diagnostic circuit determines the amount of current flowing through the electrical conductor.

The current diagnostic circuit may also be electrically isolated from the controller (e.g., the ground potentials of the current diagnostic circuit and the controller are different). In this way, the current diagnostic circuit determines the current flowing through the electrical conductor of the isolating device in an independent, electrically isolated manner as compared to the manner in which the controller determines the current flowing through the electrical conductor of the isolating device.

There may be various advantages of determining the amount of current flowing through the electrical conductor of the isolating device with the current diagnostic circuit. As one example, the amount of current flowing through the electrical conductor of the isolating device, as determined by the current diagnostic circuit, can be used as for diagnostic purposes. For instance, the amount of current flowing through the electrical conductor of the isolating device, as determined by the current diagnostic circuit, can be used as a plausibility check with the amount of current flowing through the electrical conductor of the isolating device, as determined by the controller. If the determined amounts of current flowing through the electrical conductor are different, the controller may determine that there is potential for failure in the system.

As another example, the current diagnostic circuit may provide fast overcurrent protection. For instance, if the current flowing through the electrical conductor of the isolating device becomes too high (e.g., possibly due to a short), the current diagnostic circuit may immediately disable the high-side switch so current cannot flow to the electrical motor.

In some techniques, a separate shunt resistor is placed in series with the electrical conductor of the isolating device, and the voltage drop across this shunt resistor is used for determining the amount of current flowing to the electrical motor. However, the usage of the separate shunt resistor increases components (and thereby cost), requires precise and expensive resistors, creates undesirable voltage drop that reduces power to the electrical motor, and potentially causes cooling issues if the shunt resistor becomes too hot in operation.

In the techniques described in this disclosure, such a separate shunt resistor may be avoided or eliminated. Instead, the techniques leverage the electrical conductor of the isolating device as a shunt. Accordingly, in some cases, very little modifications to the system are needed because the isolating device may pre-exist in the system. In this case, the modifications may be designed to determine the voltage drop across the electrical conductor of the isolating device, rather than a shunt resistor.

FIG. 1 is a block diagram illustrating an example system for driving an N-phase electrical motor. For example, FIG. 1 illustrates system 10 which includes power inverter 12, shunts 14A-14C (collectively referred to as "shunts 14"), motor 16, and shunt voltage measurement devices 18A-18C (collectively referred to as "shunt voltage measurement devices 18"). In the example of FIG. 1, motor 16 is a three-phase electrical motor. In this example, each phase contains a shunt and a shunt voltage measurement device. In some examples, some phases do not contain a shunt and a shunt voltage measurement device.

Examples of shunts 14 include resistors. Examples of motor 16 include motors for automotive applications, induction motors, motors for heating, ventilation, and air conditioning (HVAC), or any other type of motor. Indeed, the techniques described in this disclosure are not limited to motor applications, and can be extended to any application in which current is delivered to a load (e.g., motor 16 in FIG. 1).

In the example of FIG. 1, power inverter 12 delivers current to motor 16. For example, power inverter 12 delivers currents Ia, Ib, and Ic, which correspond to one of the three phases. In this example, power inverter 12 is illustrated as a typical three-phase power inverter topology which includes three half-bridges. For example, a first bridge includes switches Tah and Tal for a first phase, a second bridge includes switches Tbh and Tbl for a second phase, and the third bridge includes switches Tch and Tcl for a third phase. Switches Tah, Tal, Tbh, Tbl, Tch, and Tcl of power inverter 12 may be power switches such as metal-oxide-semiconductor field-effect transistors (MOSFETs) or insulated-gate bipolar transistors (IGBTs).

To deliver the currents Ia, Ib, and Ic during respective phases, a controller (not shown) causes drivers (not shown) of switches Tah, Tal, Tbh, Tbl, Tch, and Tcl of power inverter 12 to selectively enable and disable switches Tah, Tal, Tbh, Tbl, Tch, and Tcl. For example, when switch Tah is enabled (i.e., closed) and switch Tal is disabled (i.e., opened), current Ia flows from Vp to motor 16 via shunt 14A. Similarly, when switch Tbh is enabled and switch Tbl is disabled, current Ib flows from Vp to motor 16 via shunt 14B, and when switch Tch is enabled and switch Tcl is disabled, current Ic flows from Vp to motor 16 via shunt 14C.

There may be various ways in which to provide voltage Vp across the switches. As one example, a power source may provide voltage Vp. As another example, a charged capacitor may provide voltage Vp. In general, Vp and/or ground (0V) of power inverter 12 may be different than the power and/or ground of the controller. As described in more detail, there may be an isolation barrier between the controller and the drivers of the switches of power inverter 12 and power inverter 12 such that there is no direct current path from the controller to the drivers of the switches of power inverter 12 and power inverter 12.

In the example of FIG. 1, the controller may cause the drivers to selectively enable and disable switches Tah, Tal, Tbh, Tbl, Tch, and Tcl such that the phase between currents Ia, Ib, and Ic is approximately 120° (i.e., 360°/3 is 120°). Because currents Ia, Ib, and Ic are each currents for three-phase motor 16, currents Ia, Ib, and Ic may be referred to as phase currents. For example, the controller may output pulse width modulated (PWM) signals that cause the drivers to selectively enable and disable the switches of power inverter 12 at approximately 20 kHz or higher (e.g., outside of the audible range so that humans do not hear a whistling sound). In this example, the cycle is 50 micro-seconds (us) (i.e., 1/20 k). The 20 kHz rate for enabling and disabling switches is provided for purposes of illustration only and should not be considered limiting.

During operation of the motor 16, it may be beneficial to determine the amount of current that is delivered to motor 16 (i.e., the values of Ia, Ib, and Ic during operation). To determine the values of Ia, Ib, and Ic, system 10 includes shunt voltage measurement devices 18 that measure the voltage drop across respective shunts 14. For example, phase current Ia flowing through shunt 14A causes a voltage drop across shunt 14A that shunt voltage measurement device 18A measures. Shunt voltage measurement device 18A may output the measured voltage to the controller, and the controller may determine the value of Ia by dividing the measured voltage with the known resistance of shunt 14A. The controller may similarly determine the values of Ib and Ic.

However, there may be certain drawbacks with determining the values of Ia, Ib, and Ic in this manner. For example, to determine the values of Ia, Ib, and Ic, shunts 14A, 14B, and 14C may need to be relatively high-quality resistors that provide precise resistance. Such high-quality resistors may be fairly expensive. As another example, if Ia, Ib, and Ic are too small or the resistance of shunts 14A, 14B, and 14C is too small, the voltage drop may be too small leading to imprecise measurements by shunt voltage measurement devices 18.

It may be possible to increase the resistance of shunts 14A, 14B, and 14C to increase the voltage drop. However, an increase in the voltage drop across shunts 14A, 14B, and 14C reduces the power delivered to motor 16. Also, an increase in the voltage drop across shunts 14A, 14B, and 14C results in shunts 14A, 14B, and 14C heating more. Such heating may, in turn, lead to cooling issues that are undesirable.

FIG. 1 also illustrates phase nodes 20A, 20B, and 20C at the intersection of switches Tah and Tal, switches Tbh and Tbl, and switches Tch and Tcl, respectively. When switches Tal, Tbl, and Tcl are enabled and switches Tah, Tbh, and Tch are disabled, the voltage at phase nodes 20A, 20B, and 20C is zero volts. When switches Tah, Tbh, and Tch are enabled and switches Tal, Tbl, and Tcl are disabled, the voltage at phase nodes 20A, 20B, and 20C rises to Vp volts. In some examples, the voltage rises from zero volts to Vp volts at phase nodes 20A, 20B, and 20C rapidly. For example, the rate of the voltage rise from zero volts to Vp volts (i.e., dV/dt) may be approximately 5 kV/us to 10 kV/us, or even greater.

Such a fast rise in the voltage makes it difficult for shunt voltage measurement devices 18 to accurately measure the instantaneous voltage drop across shunts 14, which results in imprecise determination of the values of phase currents Ia, Ib, and Ic. For example, the voltage at phase nodes 20A, 20B, and 20C may rise from 0 volts to approximately 700 volts rapidly, but the voltage drop across shunts 14 may be approximately 0.5 volts. In this case, there is very high common mode, and very little change in voltage which makes it difficult for shunt voltage measurement devices 18 to precisely measure the voltage drop across shunts 14.

Furthermore, as described above, power inverter 12 and the controller are isolated from one another via an isolation barrier. The isolation barrier may also isolate shunt voltage measurement devices 18 and the controller. This isolation requires the output of shunt voltage measurement devices 18 to cross the isolation barrier to reach the controller, or at least requires a level shifting because the controller and shunt voltage measurement devices 18 are not referenced to the same ground potential.

For the above reasons, the example illustrated in FIG. 1 may be undesirable or unsuited for determining the amount of current being delivered to motor 16. In some cases, the drawbacks described with respect to the example illustrated in FIG. 1 may be especially acute in high power applications such as for hybrid cars or control of electrical machines. However, it may still be beneficial to determine the amount of current that flows to motor 16 during runtime, such as for torque control algorithms, safety and diagnostic purposes to detect aging effects, analyze sudden failures, and/or provide plausibility checks (i.e., verify the current measurements).

In accordance with the techniques described in this disclosure, shunts 14 may be eliminated and replaced with an isolation device that includes a conducting element referred to as an electrical conductor. The isolation device may output a signal that indicates the amount of current flowing through the electrical conductor.

Furthermore, the techniques of this disclosure may leverage the use of the electrical conductor of the isolation device for additional purposes. For example, by determining the voltage drop across the electrical conductor and determining the amount of current flowing to motor 16 based on the determined voltage drop, the techniques provide for another manner in which to determine the amount of current flowing to motor 16 (e.g., a supplemental measurement of the current flowing to motor 16). By determining the amount of current flowing to motor 16 based on the voltage drop across the electrical conductor, the techniques may provide fast overcurrent protection. For example, rather than waiting on the controller to determine that more current is flowing to motor 16 than desired, the techniques may immediately disable one or more of switches Tah, Tbh, and Tch to limit current from flowing into motor 16 without passing through any isolation barrier. Examples of an isolation barrier are described below.

Figure 2:
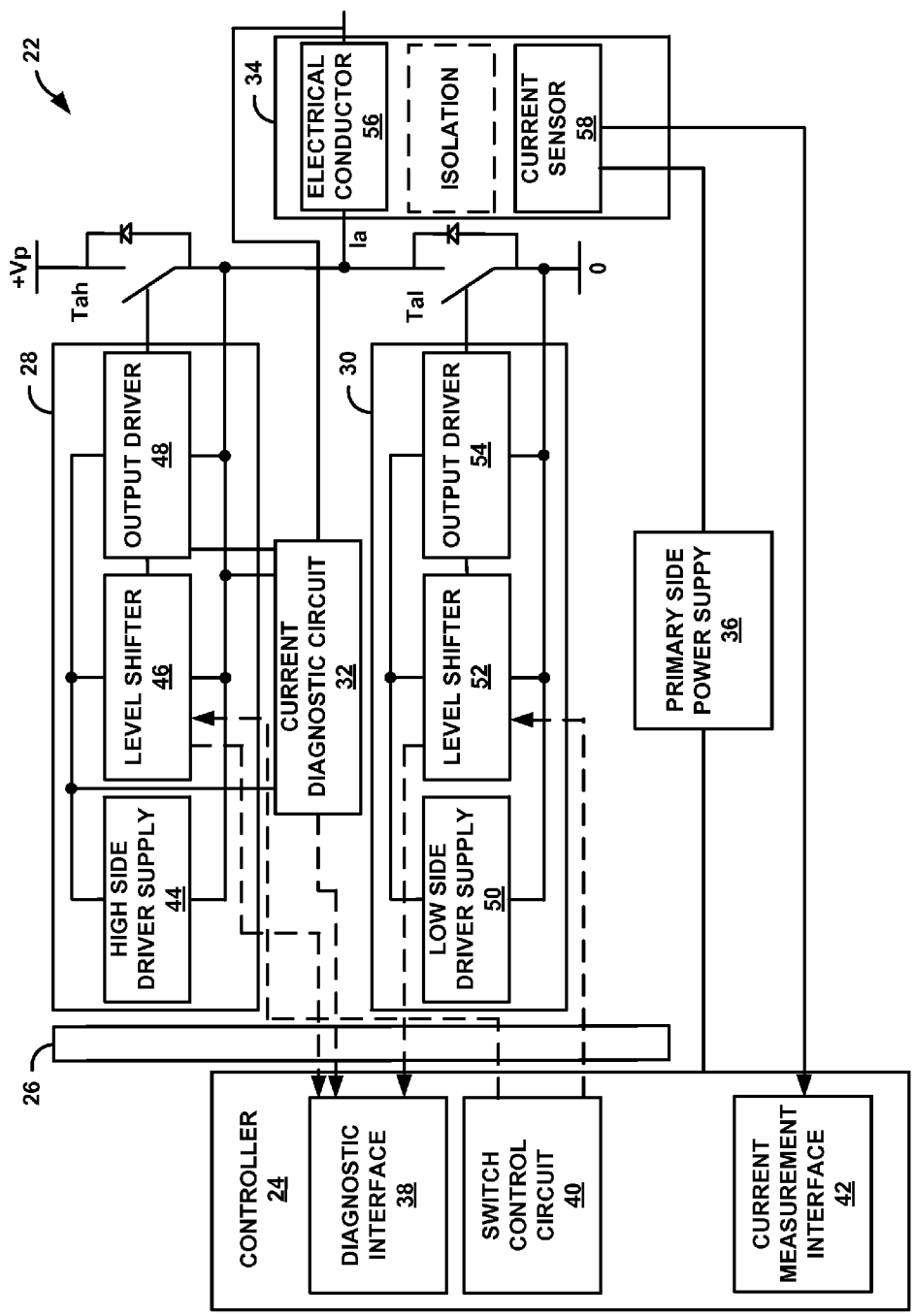
FIG. 2 is a block diagram illustrating another example system for driving an N-phase electrical motor.

FIG. 2 is a block diagram illustrating another example system for driving an N-phase electrical motor. For example, FIG. 2 illustrates system 22 that includes controller 24, isolation barrier 26, high-side gate driver 28, low-side gate driver 30, current diagnostic circuit 32, and isolation device 34. System 22 is also illustrated to include switches Tah and Tal, which are identical to switches Tah and Tal of FIG. 1 (e.g., of power inverter 12). For ease of illustration, only one of the half bridge topology (e.g., switches Tah and Tal) is illustrated in FIG. 2. The other half bridge topologies (e.g., switches Tbh and Tbl and switches Tch and Tcl) may be driven similar to the manner in which switches Tah and Tal are driven in the example illustrated in FIG. 2.

For example, there may exist respective high-side gate drivers (not shown) for each of switches Tbh and Tch and respective low-side gate drivers (not shown) for each of switches Tbl and Tcl. Switches Tbh and Tbl and switches Tch and Tcl are coupled to respective isolation devices similar to isolation device 34. Also, the electrical conductors of the isolation devices may be coupled to respective current diagnostic circuits similar to current diagnostic circuit 32.

Isolation barrier 26 splits system 22 into a primary side and a secondary side. As described below, isolation barrier 26 may not be necessary in every example, and level shifter 46 of high-side gate driver 28 and level shifter 52 of low-side gate driver may provide the functionality of isolation barrier 26. The primary side includes components to the left of isolation barrier 26, and the secondary side includes components to the right of isolation barrier 26 in FIG. 2. In general, the components on opposite sides of isolation barrier 26 may be referenced to different potentials. For example, controller 24 is powered by primary side power supply 36, high-side gate driver 28 and current diagnostic circuit 32 are powered by high-side driver supply 44, low-side gate driver 30 is powered by low-side driver supply 50, and the current that flows through isolation device 34 (e.g., current Ia) originates from the power supply that provides voltage Vp. The secondary side includes high-side gate driver 28 and low-side gate driver 30 structures.

In this example, the ground potential of primary side power supply 36, high-side driver supply 44, and low-side driver supply 50 may all be different, and the positive potential of primary side power supply 36, high-side driver supply 44, low-side driver supply 50, and the Vp may all be different. In these examples, there may be no direct current path from controller 24 (e.g., the primary side) to high-side gate driver 28, low-side gate driver 30, current diagnostic circuit 32, and isolation device 34. As described in more detail below, current sensor 58, isolation device 34, refers to the ground potential of controller 24 (primary side supply). For example, primary side power supply 36 provides power to both controller 24 and current sensor 58.

In some examples, any signal that is transmitted from the primary side and received by the secondary side, or vice-versa travels through isolation barrier 26. To illustrate this, signals that pass through isolation barrier 26, or are otherwise isolated, are illustrated in dashed lines. For instance, a signal transmitted from the secondary side is referenced to the potential of one of the power supplies of the secondary side. Isolation barrier 26 receives the signals and references the signals to the potential of the power supply of the primary side. Similarly, a signal transmitted from the primary side is referenced to the potential of the power supply of the primary side. Isolation barrier 26 receives the signals and references the signals to the potential of one of the power supplies of the secondary side.

For example, isolation barrier 26 includes a plurality of transformers. One side of the transformer, which is referenced to the primary side, receives the signal from the primary side. The signal causes a voltage at the other side of the transformer, where the other side of the transformer is referenced to the secondary side. The secondary side then receives the information. Similarly, one side of another transformer receives the signal from the second side, which is referenced to the secondary side. The signal causes a voltage at the other side of the transformer that is referenced to the primary side. In this example, the transformer breaks a direct current path from the primary side to the secondary side, and vice-versa. Utilizing transformers to provide isolation between the primary side and the secondary side is provided for purposes of illustration only and should not be considered limiting. In general, any technique that provides isolation may be utilized, such as optical methods.

In some examples, isolation barrier 26 may not be necessary in system 22. For example, level shifter 46 of high-side gate driver 28 and level shifter 52 of low-side gate driver 30 may be configured to provide the electrical isolation. For example, level shifter 46 and level shifter 52 may include transformers, optical isolators, or other components that provide the electrical isolation between controller 24 and high-side gate driver 28 and low-side gate driver 30. Accordingly, isolation barrier 26 is optional. In some examples, system 22 may include isolation barrier 26 if high-side gate driver 28 and low-side gate driver 30 do not include level shifter 46 and level shifter 52, respectively, or are not configured to provide electrical isolation with controller 24. In some cases, even in examples where level shifter 46 and level shifter 52 provide electrical isolation, system 22 may still include isolation barrier 26. In this way, different types of high-side gate drivers and low-side gate drivers may be utilized without any negative impact with respect to the electrical isolation.

Controller 24 may function as the system control unit for system 22. For example, controller 24 may be a digital or analog integrated circuit (IC) chip, and primary side power supply 36 provides power to controller 24. As one example, primary side power supply 36 provides 3.3 volts or 5 volts to controller 24.

Examples of controller 24 include controllers in the XC2xxx, TC17xx, TC19xx, XMC1xxx, and XMC4xxx family of controllers by Infineon®. However, controller 24 need not be limited to any specific type or model of chip. In general, controller 24 may comprise one or more digital signal processors (DSPs), general purpose microprocessors, application specific integrated circuits (ASICs), field programmable logic arrays (FPGAs), or other equivalent integrated or discrete logic circuitry.

As illustrated, controller 24 includes diagnostic interface 38, switch control circuit 40, and current measurement interface 42. Diagnostic interface 38, switch control circuit 40, and current measurement interface 42 are illustrated as being functionally separate components for each of description. Diagnostic interface 38, switch control circuit 40, and current measurement interface 42 may be separate components within controller 24 or may be formed together within controller 24.

Although controller 24 is illustrated as including diagnostic interface 38, switch control circuit 40, and current measurement interface 42, the techniques described in this disclosure are not so limited. In some examples, one or more of diagnostic interface 38, switch control circuit 40, and current measurement interface 42 may be external to controller 24. In these examples, controller 24 may be configured to control the functionality of the external one or more diagnostic interface 38, switch control circuit 40, and current measurement interface 42. Controller 24 may also include additional components than those illustrated.

High-side gate driver 28 is supplied by high-side driver supply 44 and includes level shifter 46, and output driver 48, and low-side gate driver 30 is supplied by low-side driver supply 50 and includes level shifter 52, and output driver 54. High-side driver supply 44 and low-side driver supply 50 may be separate, independent power supplies. In other words, high-side driver supply 44 and low-side driver supply 50 are electrically isolated from one another. One example of high-side gate driver 28 and low-side gate driver 30 is the EiceDRIVER™ product 2EDxxx family by Infineon®.

High-side gate driver 28 may be configured to enable and disable switch Tah, and low-side gate driver 30 may be configured to enable and disable switch Tal. As illustrated, switch control circuit 40 of controller 24 outputs a signal, such as a pulse width modulated (PWM) signal, to level shifter 46 of high-side gate driver 28 and to level shifter 52 of low-side gate driver 30. In response, level shifter 46 causes output driver 48 to output a voltage that causes switch Tah to enable or disable, and level shifter 52 causes output driver 54 to output a voltage that causes switch Tal to enable to disable. When Tah is enabled, Tal is disabled, and when Tal is enabled, Tah is disabled.

Level shifter 46 and level shifter 52 may also output diagnostic information of high-side gate driver 28 and low-side gate driver 30 to diagnostic interface 38. For example, if any component within high-side date driver 28 or low-side gate driver 30 experiences a malfunction, level shifter 46 or level shifter 52 may output diagnostic information indicating as such to diagnostic interface 38 of controller 24. Controller 24 in turn may determine whether any addition action needs to be taken, such as provide an indication of malfunction or in some other way indicate that a malfunction occurred, including stopping current from flowing to the load (e.g., motor 16).

When Tah is enabled and Tal is disabled, current Ia flows from Vp, through Tah, and through isolation device 34 to motor 16. Isolation device 34 includes electrical conductor 56 (sometimes referred to as a conducting element) and current sensor 58, which is isolated from electrical conductor 56 as indicated by the dashed box (e.g., an air gap or some other insulation). In other words, the isolation breaks any direct connection between electrical conductor 56 and current sensor 58. One example of isolation device 34 is a Hall sensor such as TLI4970 by Infineon. However, any device that isolates the conducting path from the sensing path may be utilized.

In FIG. 2, current Ia flows through electrical conductor 56 of isolation device 34. The flow of current through electrical conductor 56 causes a magnetic field. Current sensor 58 senses that magnetic field and outputs a signal to current measurement interface 42 of controller 24. Because current sensor 58 is already isolated from electrical conductor 56, the signal that current sensor 58 outputs does not need to flow through isolation barrier 26 to current measurement interface 42.

Current measurement interface 42 receives the signal from current sensor 58 and determines the amount of current flowing through electrical conductor 56 (i.e., the value of current Ia). For example, the amplitude of the output signal of current sensor 58 may be proportional to the amount of current that flows through electrical conductor 56. Based on the proportionality of the amplitude of the output signal of current sensor 58 and the actual current flowing through electrical conductor 56, current measurement interface 42 may determine the current flowing through electrical conductor 56. Controller 24 utilizes the determined amount of current to determine whether any changes to the current that is delivered to motor 16 is needed. For instance, current measurement interface 42 is part of the control loop for controlling the amount of current that is delivered to motor 16. In this manner, controller 24 is capable of continuously determining the value of current Ia without the drawbacks associated with shunts 14 and shunt voltage measurement devices 18 described above with respect to FIG. 1.

While determining the value of current Ia with current measurement interface 42, which provides an accurate measure of the amount of current flowing to motor 16 in one of the three phases (e.g., the first of the three phases), for safety purposes, it may be beneficial to double-check or verify the current measurement. For example, it may be beneficial to perform a plausibility check to determine whether the current as measured by current measurement interface 42 is plausible.

To verify the current measurement, another measurement technique may be used (i.e., a supplemental measurement of the current flowing to the load). For example, it may be possible to include current sensors in the path of phase currents Ia, Ib, and Ic. In some cases, it may be possible to include current sensors in the path of two of the phase currents, and one current sensor that is coupled to Vp. In these cases, it is possible to determine the amount of phase current for the path that does not include the current sensors by summing the current flowing in the paths with the current sensors from the current sensed by the current sensor coupled to Vp. However, the use of current sensors may be cost prohibitive.

Alternatively, it may be possible to include shunts 14 and shunt voltage measurement devices 18, as illustrated in FIG. 1. For example, shunts 14 may be formed by resistive material in the path of phase current Ia, Ib, and Ic, and shunt voltage measurement devices 18 would measure the voltage drop across the resistive material in the path of phase current Ia, Ib, and Ic. However, there may be drawbacks associated with the use of shunts 14 and shunt voltage measurement devices 18 as described above with respect to FIG. 1.

In accordance with the techniques described in this disclosure, current diagnostic circuit 32 may determine the voltage level across electrical conductor 56 (e.g., directly across electrical conductor 56), and determine the amount of current flowing through electrical conductor 56 based on the determined voltage level as a supplemental measurement to the measurement determined using current sensor 58. For example, both contacts (e.g., both sides) of electrical conductor 56 may be coupled to inputs of current diagnostic circuit 32. Current diagnostic circuit 32 may include analog circuitry with a reference voltage, where the reference voltage is used for overcurrent protection as described below. Other examples of current diagnostic circuit 32 are possible including microcontrollers.

As illustrated in FIG. 2, current diagnostic circuit 32 receives power from high-side driver supply 44 of high-side gate driver 28. For example, the positive supply potential of current diagnostic circuit 32 is coupled to the positive supply potential of high-side driver supply 44, and the ground potential of current diagnostic circuit 32 is coupled to the ground potential of high-side driver supply 44. In this example, a ground potential of high-side gate driver 28 is related to a ground potential of current diagnostic circuit 32. For instance, the ground potentials of high-side gate driver 28 and current diagnostic circuit 32 are coupled together (e.g., both connected to the ground of high-side driver supply 44).

In the example illustrated in FIG. 2, current diagnostic circuit 32 is coupled to the output of electrical conductor 56. The input of electrical conductor 56 is coupled the ground potential of high-side driver supply 44, which is the same as the ground potential of current diagnostic circuit 32. In this way, both contacts of electrical conductor 56 (e.g., input and output of electrical conductor 56) are coupled to inputs of current diagnostic circuit 32 (e.g., coupled to current diagnostic circuit 32 and the ground potential of current diagnostic circuit 32). Therefore, the voltage that current diagnostic circuit 32 determines at the output of electrical conductor 56 with respect to the ground potential of current diagnostic circuit 32 is equal to the voltage level across electrical conductor 56 because the input of electrical conductor 56 is coupled to the ground potential of current diagnostic circuit 32.

In other words, if current diagnostic circuit 32 were to measure the voltage at the input of electrical conductor 56, current diagnostic circuit 32 would measure the voltage to be zero volts because the input of electrical conductor 56 is coupled to the same ground potential that current diagnostic circuit 32 is coupled to. Accordingly, when current diagnostic circuit 32 measures the voltage at the output of electrical conductor 56, current diagnostic circuit 32 may be considered as measuring the voltage level (e.g., drop) across electrical conductor 56.

Current diagnostic circuit 32 may combine the measured voltage with the known resistance of electrical conductor 56. For example, although electrical conductor 56 functions as a conductor, there is a certain amount of minimal resistance associated with electrical conductor 56. As one example, the resistance of electrical conductor 56 is approximately 0.6 milli-Ohms (mOhm). Additionally, the mounting techniques used to connect isolation device 34 may affect the overall resistance of isolation device 34 (e.g., the mounting wires and electrical conductor 56). For instance, if isolation device 34 is poorly mounted to switches Tah and Tal, the overall resistance of isolation device 34 may increase. However, any changes in the impedance may be relative small. For example, the total resistance of the conducting path (e.g., the bond wires and electrical conductor 56) may be approximately 0.6 mOhm+10-20%.

Current diagnostic circuit 32 may determine the supplemental measurement of the amount of current flowing through electrical conductor 56, where the supplemental measurement is supplemental to a measurement of the amount of current flowing through electrical conductor 56 determined using current sensor 58. Currently diagnostic circuit 32 may transmit data indicative of the supplemental measurement of the amount of current flowing through electrical conductor 56. For example, current diagnostic circuit 32 may output the value of the supplemental measurement of the current flowing through electrical conductor 56 based on the voltage level across electrical conductor 56 to diagnostic interface 38.

Diagnostic interface 38 may also receive the measured amount of current based on current sensor 58 from current measurement interface 42. Diagnostic interface 38 may compare the two current measurements and determine whether there are substantial differences in the measurement. For example, diagnostic interface 38 utilizes the current measurement from current diagnostic circuit 32 to determine whether the current measurement from current measurement interface 42 is plausible. In other words, diagnostic interface 38 verifies the current measurement that was determined using current sensor 58 based on the data indicating the supplemental measurement of the current as determined by current diagnostic circuit 32.

The current measurement from current diagnostic circuit 32 may not be as accurate as the current measurement from current measurement interface 42. Accordingly, the two current measurements may not be exactly the same, but may be within a plausible range useful for verification. For example, if the percentage difference between the current measurement from current diagnostic circuit 32 and the current measurement from current measurement interface 42 is within a plausible range, diagnostic interface 38 may determine that there is no malfunction (e.g., verify that the current measurement by current measurement interface 42 is accurate). However, if the percentage difference between the current measurement from current diagnostic circuit 32 and the current measurement from current measurement interface 42 is outside a plausible range, diagnostic interface 38 may determine that there is a malfunction (e.g., verify that the current measurement by current measurement interface 42 is not accurate).

In some cases, current diagnostic circuit 32 may measure a negative voltage level because the input to electrical conductor 56 is coupled to the ground potential and the voltage drops across electrical conductor 56. This means that the voltage at the output of electrical conductor 56 is at a lower voltage than the input of electrical conductor 56. Diagnostic interface 38 may be configured to correct for any such differences in the measured currents, as well as use such information for additional diagnostic checking.

For example, if the voltage level measured by current diagnostic circuit 32 is negative, the current determined by current diagnostic circuit 32 will also be negative. Diagnostic interface 38 may be configured to determine that when current diagnostic circuit 32 outputs a negative current value for phase current Ia, and current measurement interface 42 outputs a positive current value of phase current Ia, that the plausibility check indicates a possible malfunction of the current measurement path.

In this way, current diagnostic circuit 32 determines the amount of current flowing through electrical conductor 56 in a completely independent manner from the way in which current measurement interface 42 measures the amount of current flowing through electrical conductor 56. In other words, the supplemental measurement of the current flowing through electrical conductor 56 is independent of the measurement of the current flowing through electrical conductor 56 determined using current sensor 58. Such independence between two different ways for determining the amount of current flowing through electrical conductor 56 further ensures that a malfunction in the current measurement path or data corrupted can be detected in a reliable way.

For example, any failure in the ability of current measurement interface 42 to determine the current flowing through electrical conductor 56 does not affect the ability of current diagnostic circuit 32 to determine the amount of current flowing through electrical conductor 56. In this manner, the chance that both current measurement interface 42 and current diagnostic circuit 32 might incorrectly determine the amount of current flowing through electrical conductor 56 at the same time is very small. For example, different error scenarios would likely be needed for both current measurement interface 42 and current diagnostic circuit 32 to fail at the same time. A single error scenario that causes both current measurement interface 42 and current diagnostic circuit 32 to fail would be very unlikely.

In some examples, in addition to determining the amount of current flowing through electrical conductor 56, current diagnostic circuit 32 may also be configured to provide fast overcurrent protection independently from controller 24 and primary side supply 36. For instance, current diagnostic circuit 32 may determine the current flowing through electrical conductor 56, as described above with respect to a supplemental measurement, and if the current level is above a certain threshold, current diagnostic circuit 32 may cause output driver 48 of high-side gate driver 28 to disable switch Tah. Disabling switch Tah immediately causes the current to cease flowing through electrical conductor 56.

As one example, current diagnostic circuit 32 may determine the voltage level across electrical conductor 56. Current diagnostic circuit 32 may compare the determined voltage level with a reference voltage of current diagnostic circuit 32. If the determine voltage is greater than the reference voltage, current diagnostic circuit 32 may cause output driver 48 of high-side gate driver 38 to disable switch Tah. By selecting the value of the reference voltage within current diagnostic circuit 32, overcurrent protection can be provided for different current levels.

Using current diagnostic circuit 32 for overcurrent protection provides for fast overcurrent protection as compared to relying only on controller 24 to provide overcurrent protection. For example, relying on controller 24 to provide overcurrent protection would require waiting on current measurement interface 42 of controller 24 to determine that the current flowing through electrical conductor 56 is too high. Then, switch control circuit 40 would need to output a signal to level shifter 46 instructing level shifter 46 to cause output driver 48 to disable switch Tah. Then, output driver 48 would disable switch Tah.

For controller 24 to provide overcurrent protection may require primary side power supply 36, current sensor 58, current measurement interface 42, switch control circuit 40, isolation barrier 26, level shifter 46, and output driver 48 to all operate properly. For current diagnostic circuit 32 to provide overcurrent protection may only require output driver 48 to operate properly because the decision of whether to enable or disable switch Tah is performed locally (e.g., on the secondary side without any need to transmit data to the primary side or transmit data to any interface). In this way, overcurrent protection using current diagnostic circuit 32 may be more error resilient than relying on controller 24 to provide overcurrent protection.

As illustrated, current diagnostic circuit 32 is external to high-side gate driver 28. However, aspects of this disclosure are not so limited. For example, as described above, current diagnostic circuit 32 is powered by high-side driver supply 44, which also powers the components of high-side gate driver 28. Accordingly, in some examples, high-side gate driver 28 includes current diagnostic circuit 32.

Furthermore, as described above, level shifter 46 outputs diagnostic information to diagnostic interface 38. In examples where high-side gate driver 28 includes current diagnostic circuit 32, current diagnostic circuit 32 may output the value of the determined amount of current through level shifter 46 to diagnostic interface 38. In these examples, no additional communication interface is needed between current diagnostic circuit 32 and diagnostic interface 38. In other words, level shifter 46 may be considered as a communication interface. In examples where high-side gate driver 28 includes current diagnostic circuit 32, current diagnostic circuit 32 may transmit data via the communication interface (e.g., level shifter 46) of high-side gate driver 28.

In examples where current diagnostic circuit 32 outputs the value of the determined supplemental measurement through level shifter 46, there is an increase in the amount of data that high-side gate driver 28 outputs to diagnostic interface 38, which in turn causes a strain on the bandwidth. However, it may not be necessary for current diagnostic circuit 32 to constantly and accurately determine the amount of current flowing through electrical conductor 56, and transmit such data to diagnostic interface 38.

For instance, current measurement interface 42 may be constantly and accurately determine the amount of current flowing through electrical conductor 56. It may not be necessary to constantly perform the plausibility check (e.g., constantly verify the current measurement). Rather, a few samples of the data transmitted by current diagnostic circuit 32 per period may be sufficient to verify the current measurement by current measurement interface 42. Also, to perform the plausibility check, the exact measurement of the current is not needed. An approximation of the current level of the current flowing through electrical conductor 56 may be sufficient.

In some examples, current diagnostic circuit 32 may periodically determine a low resolution value for the amount of current flowing through electrical conductor 56 and periodically transmit the data (e.g., value) of the amount of current flowing through electrical conductor 56 to diagnostic interface 38. Therefore, the increase in the amount of data that high-side gate driver 28 would need to transmit to diagnostic interface 38 is minimal in examples where high-side gate driver 28 includes current diagnostic circuit 32, which in turn places minimal strain on the bandwidth.

Also, high levels of precision with respect to current measurement may not be required for the overcurrent protection because overcurrent protection is used to protect at least the switches from needing to flow too much current. For example, assume that the current diagnostic circuit 32 is configured to provide overcurrent protection for current over 150% of the nominal operating current (i.e., the overcurrent level is 150% of the nominal operating current). In this example, because current diagnostic circuit 32 does not precisely determine the amount of current flowing through electrical conductor 56, it may be possible that current diagnostic circuit 32 provides overcurrent protection at 155% or 145% of the nominal operating current.

Any lack in precision of the measurements of current diagnostic circuit 32 for overcurrent protection can be corrected by adjusting the level at which current diagnostic circuit 32 provides overcurrent protection. For instance, if it is critical to provide overcurrent protection at 150% of the nominal current, current diagnostic circuit 32 may be configured to provide overcurrent protection at 125% of the nominal current so that any lack of precision in the measurements of current diagnostic circuit 32 does not affect the critical protection. Also, because current measurement interface 42 is part of the control loop to adjust the current flowing to motor 16 during operation, any lack of precision in the measurements of current diagnostic circuit 32 does not affect the control loop.

However, it should be noted that if the nominal current is 50 amps (A), the resistance of electrical conductor 56 is 6 mOhms, and the overcurrent protection level is 150% of the nominal current (i.e., 75 A), then the voltage drop across electrical conductor 56 is approximately 45 milli-volts (mV) (i.e., 75 A*0.6 mOhms equals 45 mV). Current diagnostic circuit 32 may be able to accurately measure 45 mV. Therefore, even if high precision is not required for the overcurrent protection, it may be possible for current diagnostic circuit 32 to provide high precision overcurrent protection.

As described above, the resistance of electrical conductor 56 is approximately 0.6 mOhm. If the nominal operating current is 50 A, then the amount of power dissipated by electrical conductor 56 is approximately 1.5 Watts (W) (i.e., $50^2*0.0006$ equals 1.5 W). Electrical conductor 56 dissipating 1.5 W may not be sufficient to heat isolation device 34. In other words, because the resistance of electrical conductor 56 is only 0.6 mOhms, there may be little to no cooling issues in the nominal operating range of 50 A.

As described above, FIG. 2 illustrates current diagnostic circuit 32 for one switch pair (e.g., switch Tah and Tal). In some examples, it may not be necessary to include current diagnostic circuits for all three switch pairs. For example, for a three-phase motor 16, one requirement may be that currents Ia, Ib, and Ic sum to be zero. Accordingly, if two phase currents are measured, it may be possible to determine the third phase current. However, utilizing three current diagnostic circuits (one for each phase current) may be useful for providing additional plausibility checks.

Figure 3:
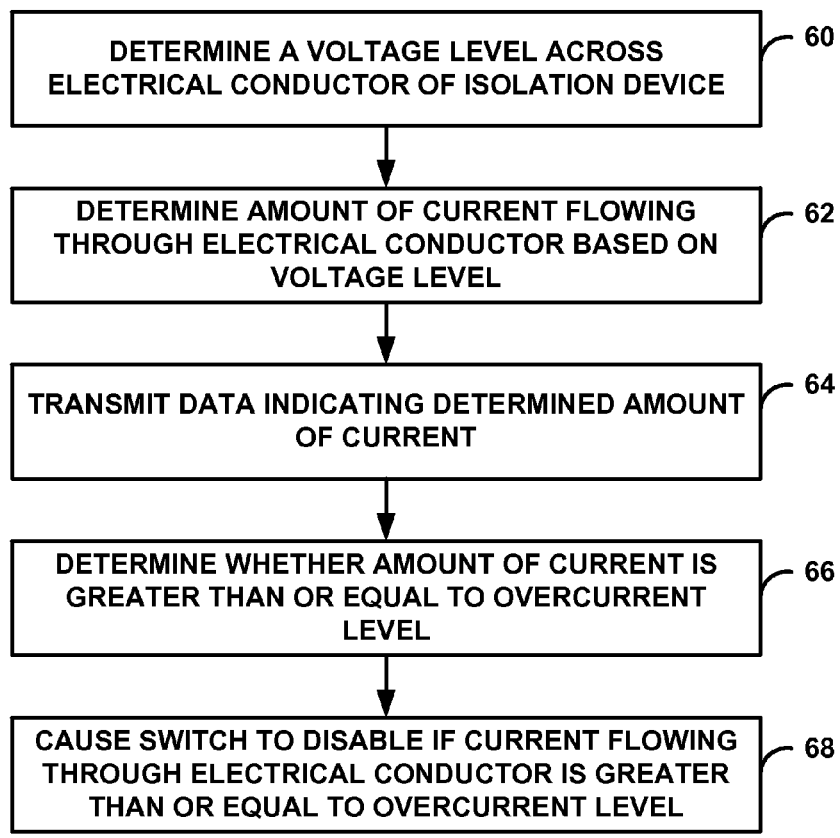
FIG. 3 is a flowchart illustrating an example operation in accordance with one or more techniques described in this disclosure.

FIG. 3 is a flowchart illustrating an example operation in accordance with one or more techniques described in this disclosure. For purposes of illustration, the example of FIG. 3 is described with respect to system 22 of FIG. 2.

In the process shown in FIG. 3, current diagnostic circuit 32 may determine a voltage level across electrical conductor 56 (e.g., directly across electrical conductor 56) of isolation device 34 (60). For example, in the techniques described in this disclosure, there may not be a need to measure the voltage level across a separate shunt that is in the current path. Rather, electrical conductor 56 of isolation device 34 forms as an auxiliary shunt.

In this example, an input of electrical conductor 56 is coupled to a ground potential of current diagnostic circuit 32. For example, current diagnostic circuit 32 is powered by the same power supply (i.e., high-side driver supply 44) that powers the components of high-side gate driver 28.

Current diagnostic circuit 32 may determine a supplemental measurement of the amount of current flowing through electrical conductor 56 based on the determined voltage level (62). The supplemental measurement is supplemental to a measurement of the amount of current flowing through the electrical conductor determined using current sensor 58. For example, the resistance of electrical conductor 56 may be approximately 0.6 mOhm, and by dividing the determined voltage drop with the known resistance, current diagnostic circuit 32 may determine the amount of current flowing through electrical conductor 56.

Current diagnostic circuit 32 may transmit data indicating the supplemental measurement of the amount of current flowing through the electrical conductor (64). The supplemental measurement may be for verifying the measurement of the amount of current flowing through electrical conductor 56 with sensor 58 of isolation device 34. For example, current diagnostic circuit 32 may transmit the value of the supplemental measurement of the amount of current flowing through electrical conductor 56 to controller 24 (e.g., via isolation barrier 26). Controller 24 may utilize the value of the supplemental measurement of the amount of current flowing through electrical conductor 56 to determine whether a measurement of the current flowing through electrical conductor 56 is plausible.

In some examples, current diagnostic circuit 32 may transmit the data via high-side gate driver 28. For example, level shifter 46 of high-side gate driver 28 may be configured to transmit diagnostic information to controller 24, and current diagnostic circuit 32 may transmit the data via level shifter 46.

Current diagnostic circuit 32 may determine whether the amount of current flowing through electrical conductor 56 is greater than or equal to an overcurrent level (66). If current diagnostic circuit 32 determines that the amount of current flowing through electrical conductor 56 is greater than or equal to the overcurrent level, current diagnostic circuit 32 may cause switch Tah to limit the current from flowing through electrical conductor 56 by disabling switch Tah (68). For example, current diagnostic circuit 32 may cause output driver 48 to cause Tah to disable if current diagnostic circuit 32 determines that the current flowing through electrical conductor 34 is greater than or equal to the overcurrent level.

Figure 4:
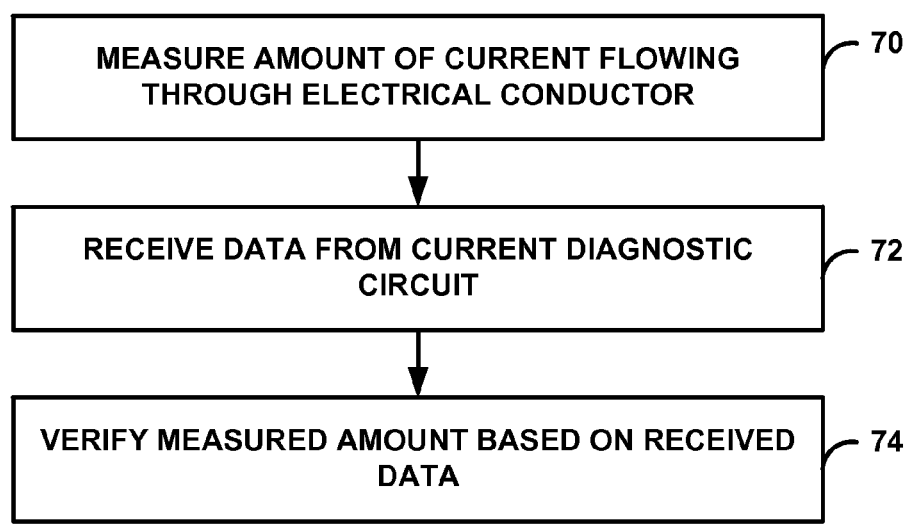
FIG. 4 is a flowchart illustrating another example operation in accordance with one or more techniques described in this disclosure.

FIG. 4 is a flowchart illustrating another example operation in accordance with one or more techniques described in this disclosure. For purposes of illustration, the example of FIG. 4 is described with respect to system 22 of FIG. 2.

In the process shown in FIG. 4, controller 24 may measure the amount of current flowing through electrical conductor 56 based on a signal outputted by current sensor 58 (70). For example, current sensor 58 is isolated from electrical conductor 56, and current measurement interface 42 may continuously measure the current flowing through electrical conductor 56 based on the signal outputted by current sensor 58.

Controller 24 may also receive data indicative of the determined amount of current flowing through electrical conductor 56 as determined by current diagnostic circuit 32 (i.e., data of the supplemental measurement) (72). In this example, controller 24 and current diagnostic circuit 32 are referenced to different potentials. Accordingly, controller 24 receives the data indicative of the determined amount of current flowing through electrical conductor 56 via isolation barrier 26. Controller 24 may verify the measurement of the amount of electrical current flowing through electrical conductor 56 is plausible based on the received data indicative of the determined amount of current flowing through electrical conductor 56 (74). For example, controller 24 may determine whether the measurement of the amount of electrical current flowing through electrical conductor 56 is plausible based on the received data indicative of the supplemental measurement of the amount of current flowing through electrical conductor 56.

Various examples of the techniques have been described. These and other examples are within the scope of the following claims.

What is claimed is:

1. A system comprising:
an isolation device that includes an electrical conductor and a current sensor, wherein the current sensor is configured to output a signal indicative of an amount of current flowing through the electrical conductor; and
a current diagnostic circuit configured to:
determine a voltage level across the electrical conductor of the isolation device; and
determine a supplemental measurement of an amount of current flowing through the electrical conductor based on the determined voltage, wherein the supplemental measurement is supplemental to a measurement of the amount of current flowing through the electrical conductor determined using the sensor of the isolation device.

2. The system of claim 1, wherein the current diagnostic circuit is configured to transmit data indicating the supplemental measurement of the amount of current flowing through the electrical conductor.

3. The system of claim 2, further comprising:
a controller configured to:
measure the amount of current that is flowing through the electrical conductor based on the signal outputted by the current sensor;
receive the data indicating the supplemental measurement from the current diagnostic circuit; and
verify the measured amount of current based on the received data indicating the supplemental measurement of the amount of current flowing through the electrical conductor.

4. The system of claim 1, wherein the current diagnostic circuit is configured to determine the voltage level directly across the electrical conductor of the isolation device.

5. The system of claim 1, wherein both contacts of the electrical conductor are coupled to inputs of the current diagnostic circuit.

6. The system of claim 1, wherein the current diagnostic circuit is configured to:
determine whether the supplemental measurement of the amount of current flowing through the electrical conductor indicates that the amount of current flowing through the electrical conductor is greater than or equal to an overcurrent level; and
cause a switch to limit the current from flowing through the electrical conductor if the amount of current flowing through the electrical conductor is greater than or equal to the overcurrent level.

7. The system of claim 1, further comprising:
a switch that allows the current to flow through the electrical conductor; and
a gate driver configured to enable or disable the switch to allow or disallow the current to flow through the electrical conductor,
wherein a ground potential of the gate driver is related to a ground potential of the current diagnostic circuit.

8. The system of claim 7, wherein the gate driver comprises the current diagnostic circuit, wherein the gate driver includes a communication interface, and wherein the current diagnostic circuit is configured to transmit data indicating the supplemental measurement of the amount of current flowing through the electrical conductor via the communication interface of the gate driver.

9. The system of claim 1, further comprising:
a controller that is referenced to a ground potential different than a ground potential of the current diagnostic circuit; and
an isolation barrier,
wherein the current diagnostic circuit is configured to transmit data indicating the supplemental measurement of the amount of current flowing through the electrical conductor to the controller via the isolation barrier.

10. The system of claim 1, further comprising:
an electrical motor, wherein the current flowing through the electrical conductor drives one phase of a plurality of phases of the electrical motor.

11. A method for current diagnostic, the method comprising:
determining a voltage level across an electrical conductor of an isolation device, wherein the isolation device includes the electrical conductor and a current sensor, and wherein the current sensor is configured to output a signal indicative of an amount of current flowing through the electrical conductor; and
determining a supplemental measurement of an amount of current flowing through the electrical conductor based on the determined voltage, wherein the supplemental measurement is supplemental to a measurement of the amount of current flowing through the electrical conductor determined using the sensor of the isolation device.

12. The method of claim 11, further comprising:
transmitting data indicating the supplemental measurement of the amount of current flowing through the electrical conductor.

13. The method of claim 12, further comprising:
measuring the amount of current that is flowing through the electrical conductor based on the signal outputted by the current sensor;
receiving the data indicating the supplemental measurement of the amount of current flowing through the electrical conductor; and
verifying the measured amount of current based on the received data indicating the supplemental measurement of the amount of current flowing through the electrical conductor.

14. The method of claim 11, wherein determining the voltage level across the electrical conductor comprises determining, with a current diagnostic circuit, a voltage level directly across an output of the electrical conductor and an input of the electrical conductor.

15. The method of claim 11, further comprising:
determining whether the supplemental measurement of the amount of current flowing through the electrical conductor indicates that the amount of current flowing through the electrical conductor is greater than or equal to an overcurrent level; and
causing switch to limit the current from flowing through the electrical conductor if the amount of current flowing through the electrical conductor is greater than or equal to the overcurrent level.

16. The method of claim 15,
wherein determining whether the supplemental measurement of the amount of current flowing through the electrical conductor indicates that the amount of current flowing through the electrical conductor is greater than or equal to the overcurrent level comprises determining, with a current diagnostic circuit, whether the supplemental measurement of the amount of current flowing through the electrical conductor indicates that the amount of current flowing through the electrical conductor is greater than or equal to the overcurrent level,
wherein causing the switch to limit comprises causing, with a gate driver, the switch to limit the current from flowing through the electrical conductor if the amount of current flowing through the electrical conductor is greater than or equal to the overcurrent level.

17. The method of claim 11, further comprising:
driving one phase of a plurality of phases of an electrical motor with the current flowing through the electrical conductor.

18. A system comprising:
means for determining a voltage level across an electrical conductor of an isolation device, wherein the isolation device includes the electrical conductor and a current sensor, and wherein the current sensor is configured to output a signal indicative of an amount of current flowing through the electrical conductor; and means for determining a supplemental measurement of an amount of current flowing through the electrical conductor based on the determined voltage, wherein the supplemental measurement is supplemental to a measurement of the amount of current flowing through the electrical conductor determined using the sensor of the isolation device.

19. The system of claim 18, further comprising:

means for transmitting data indicating the supplemental measurement of the amount of current flowing through the electrical conductor.

20. The system of claim 18, further comprising:

means for determining whether the supplemental measurement of the amount of current flowing through the electrical conductor indicates that the amount of current flowing through the electrical conductor is greater than or equal to an overcurrent level; and means for causing a switch to limit the current from flowing through the electrical conductor if the amount of current flowing through the electrical conductor is greater than or equal to the overcurrent level.

* * * * *